United States Patent
Hara

(10) Patent No.: US 10,527,804 B2
(45) Date of Patent: Jan. 7, 2020

(54) OPTICAL MODULE

(71) Applicant: SUMITOMO ELECTRIC INDUSTRIES, LTD., Osaka-shi (JP)

(72) Inventor: Hiroshi Hara, Osaka (JP)

(73) Assignee: Sumitomo Electric Industries, Ltd., Osaka-shi (JP)

( * ) Notice: Subject to any disclaimer, the term of this patent is extended or adjusted under 35 U.S.C. 154(b) by 0 days.

(21) Appl. No.: 16/245,303

(22) Filed: Jan. 11, 2019

(65) Prior Publication Data
US 2019/0212508 A1  Jul. 11, 2019

(30) Foreign Application Priority Data

Jan. 11, 2018 (JP) ................ 2018-002857

(51) Int. Cl.
| | |
|---|---|
| G02B 6/42 | (2006.01) |
| H01S 5/022 | (2006.01) |
| H01L 23/495 | (2006.01) |
| G02B 6/43 | (2006.01) |

(52) U.S. Cl.
CPC ......... *G02B 6/4257* (2013.01); *G02B 6/4295* (2013.01); *G02B 6/43* (2013.01); *H01L 23/49579* (2013.01); *H01S 5/02248* (2013.01)

(58) Field of Classification Search
CPC ...... G02B 6/4257; G02B 6/4295; G02B 6/43; H01L 23/49579; H01S 5/02248
See application file for complete search history.

(56) References Cited

U.S. PATENT DOCUMENTS

| | | | |
|---|---|---|---|
| 2012/0128290 A1* | 5/2012 | Han ................ | G02B 6/4206 385/14 |
| 2016/0349470 A1* | 12/2016 | Cheng .............. | G02B 6/4204 |
| 2017/0310078 A1 | 10/2017 | Hirayama | |
| 2018/0123697 A1 | 5/2018 | Kubota et al. | |

FOREIGN PATENT DOCUMENTS

| | | |
|---|---|---|
| JP | 2002-280662 A | 9/2002 |
| JP | 2003-198035 A | 7/2003 |

\* cited by examiner

*Primary Examiner* — Chris H Chu
(74) *Attorney, Agent, or Firm* — Baker Botts L.L.P.; Michael A. Sartori

(57) ABSTRACT

An optical module that provides a bridge substrate for carrying a driving signal from a wiring substrate to a laser diode (LD) element is disclosed. The optical module provides a carrier, first and second assemblies, and the bridge substrate. The first assembly, which includes the LD element, stacks a first compensating substrate and a semiconductor substrate on the carrier, where the semiconductor substrate includes the LD element. The second assembly stacks a second compensating substrate and the wiring substrate on the carrier. The first compensating substrate is made of a material same with a material of the wiring substrate and has a thickness same with that of the wiring substrate. The second compensating substrate is made of a material same with a material of the semiconductor substrate and has a thickness same with that of the semiconductor substrate.

10 Claims, 13 Drawing Sheets

OPTICAL MODULE

CROSS REFERENCE TO RELATED APPLICATION

The present application is based on and claims the benefit of priority of Japanese Patent Application No. 2018-002857, filed on Jan. 11, 2018, the entire content of which is incorporated herein by reference.

TECHNICAL FIELD

1. Filed of Invention

The present invention relates to an optical module.

BACKGROUND

2. Related Background Arts

A Japanese Patent Application laid open No. JP2003-198035A has disclosed an optical module that implements a semiconductor laser diode (LD) that generates an optical signal corresponding to a driving signal contains high frequency components. The optical module disclosed therein provides first and second transmission lines extending parallel to each other on respective planes that form a pair, and a semiconductor laser diode (LD) is disposed between the paired planes. One of electrodes of the LD is electrically connected with the first transmission line through a metal block disposing therebetween. The LD is mounted on the second transmission line such that another electrode thereof faces and is in contact with the second transmission line.

Another Japanese Patent Application laid open No. JP2002-280662A has disclosed an LD module that implements an optical source unit with an LD and an optical modulator type of electro-absorption (EA) monolithically integrated with the LD on a semiconductor substrate and the source unit is mounted on a substrate. The LD module disclosed therein is mounted on the substrate such that a top surface of the integrated device faces the surface of the substrate, that is, the integrated devices is mounted on the substrate in an arrangement of junction down. Electrodes of the LD and the EA modulator are connected with pads and electrodes provided in the substrate.

An optical module applicable to a high-speed communication system often provides a wiring substrate, which carries a driving signal to an LD, arranged side by side against the LD device. In such an arrangement, a bonding wire connects the transmission line on the wiring substrate with the LD device. However, a parasitic inductive component attributed to a bonding wire possibly degrades quality of the driving signal, which not only increases signal loss between the transmission line and the LD device but degrades high frequency performance of the LD device. One solution known in the field is to connect the transmission line with the LD device by an additional transmission line provided in another wiring substrate, which will be called as a bridge substrate. The bridge substrate extends from the wiring substrate to the LD device such that a top face thereof providing the transmission line faces top surfaces of the wiring substrate and the LD device. The bridge substrate, in particular, the transmission line provided thereon, may suppress signal losses and degradation in high frequencies. However, when the top surface of the LD device and that of the wiring substrate extend unevenly, the reliability of the connection via the bridge substrate may be reduced.

SUMMARY

An aspect of the present invention relates to an optical module that comprises a carrier, the first and second assemblies, and a bridge substrate. The carrier provides a plane top surface. The first assembly, which includes a laser diode (LD) element and is provided on the plane top surface of the carrier, stacks a first compensating substrate on the plane top surface of the carrier and a semiconductor substrate on the first compensating substrate. The second assembly, which is provided on the plane top surface of the carrier, stacks a second compensating substrate on the plane top surface of the carrier and a wiring substrate on the second compensating substrate. The bridge substrate, which is provided on the wiring substrate and the semiconductor substrate, electrical connects the wiring substrate with the LD element in the semiconductor substrate. A feature of the optical module of the present invention is that the first compensating substrate is made of a material same with a material of the wiring substrate and has a thickness substantially equal to a thickness of the wiring substrate; and the second compensating substrate is made of a material same with a material of the semiconductor substrate and has a thickness substantially equal to a thickness of the semiconductor substrate.

BRIEF DESCRIPTION OF THE DRAWINGS

The foregoing and other purposes, aspects and advantages will be better understood from the following detailed description of a preferred embodiment of the invention with reference to the drawings, in which.

DETAILED DESCRIPTION

Next, some embodiments of an optical module according to the present invention will be described referring to accompanying drawings. The present invention, however, is not restricted to those embodiments but has a scope defined in claims and includes all changes and modifications done for elements in the claims and equivalent thereto. In the description of the drawings, numerals or symbols same with or similar to each other will refer to elements same with or similar to each other without duplicating explanations.

Figure 1:
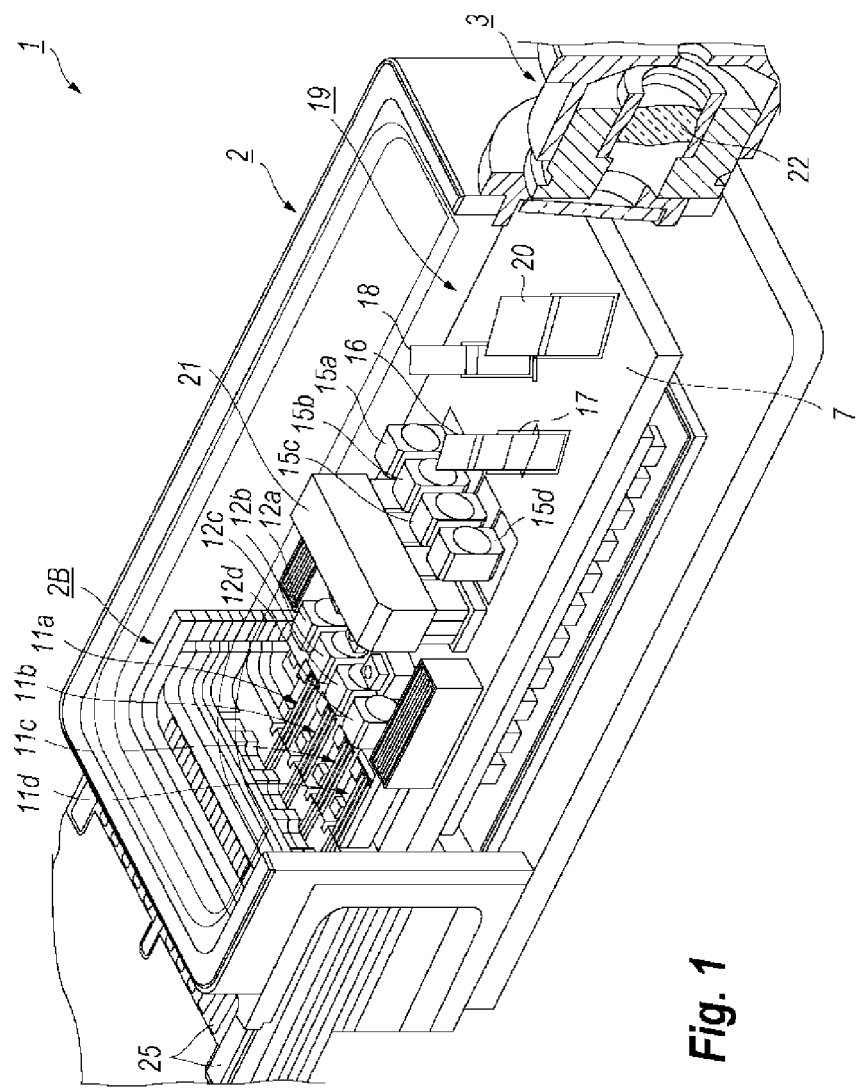
FIG. 1 is a perspective view showing an inside of an optical module according to the first embodiment of the present invention.
Figure 2:
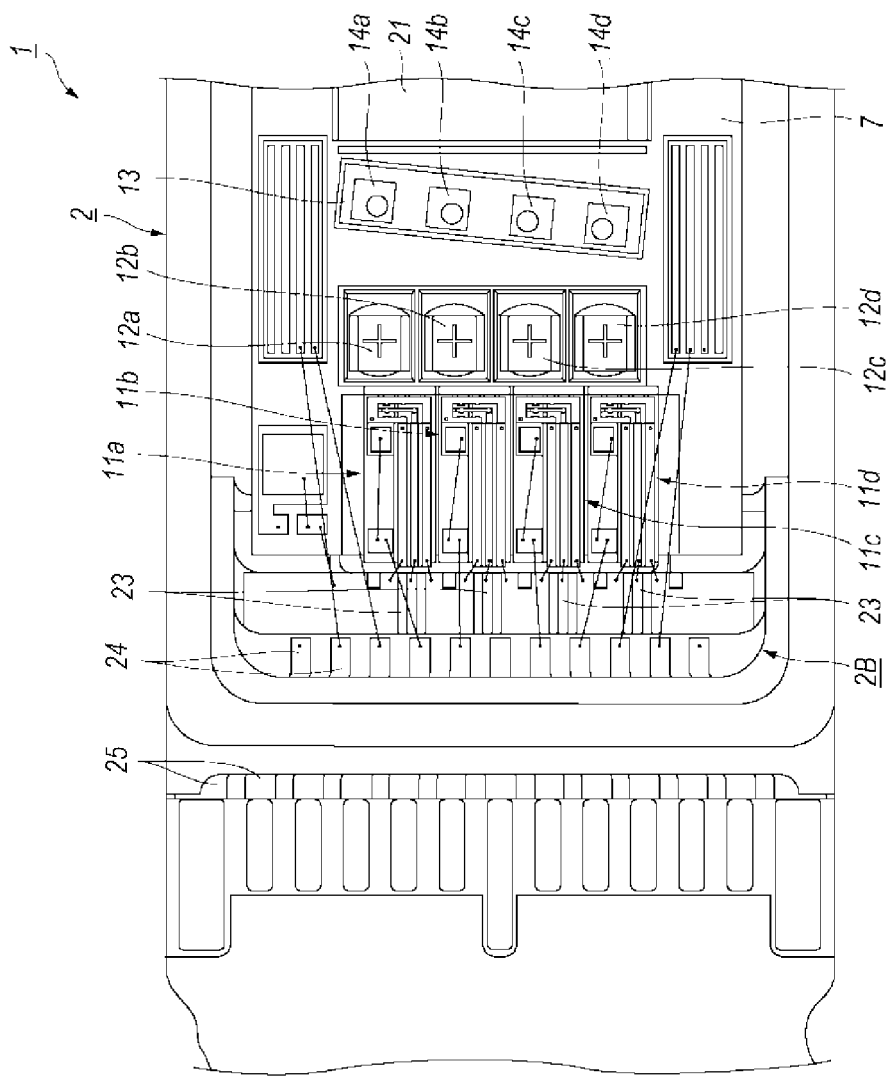
FIG. 2 is a plan view magnifying source units installed within the optical module shown in FIG. 1.

FIG. 1 is a perspective view showing an inside of an optical module 1 according to an embodiment of the present inventions, and FIG. 2 is a plan view magnifying an inside of the optical module 1 shown in FIG. 1. The optical module 1, which is a type of transmitter optical sub-assembly (TOSA), has a box-shaped housing 2 and a cylindrical coupling portion 3 with a flange. The optical module 1 implements an N-count of source units, 11a to 11d, the N-count of first lenses, 12a to 12d, a mount 13, the N-count of photodiodes (PDs), 14a to 14d, the N-count of second lenses, 15a to 15d, and an optical multiplexing system 19. Thus, the optical module 1 is a type of optical transmitting module implementing four (N=4) lanes of signal channels. Those optical components including the source units, 11a to 11d, the first lenses, 12a to 12d, the mount 13, the second lenses, 15a to 15d, and the optical multiplexing system 19 are installed on a base 7 of the housing 2.

The housing 2 of the present optical module 1 further provides a feedthrough 2B that pierces a rear wall of the housing 2. An external portion of the feedthrough 2B provides terminals 25 to be coupled with an external apparatus, where the terminals 25 are disposed perpendicular to the rear wall of the housing 2. While, an internal portion of the feedthrough 2B provides terminals 24 and the N-count of signal lines 23 each extending from the terminals 25 in the external portion of the feedthrough 2B.

The source units, 11a to 11d, in the optical module 1 may be driven independently and generate optical signals also independently. The source units, 11a to 11d, are driven by respective driving signals provided from an outside of the optical module 1 through the terminals, 24 and 25. Details of the source units, 11a to 11d, will be described later in the present specification. The first lenses, 12a to 12d, which are optically coupled with the source units, 11a to 11d, receive the optical signals coming from the source units, 11a to 11d.

The mount 13, which has a rectangular plane shape with lateral sides intersecting respective optical axes of the optical signals, is disposed between the first lenses, 12a to 12d, and the second lenses, 15a to 15d. The mount 13 provides multi-layered dielectric films, which has a function of a beam splitter (BS) with a normal inclined with the optical axes of the optical signals, where the multi-layered dielectric films split the optical signals into respective two portions, respective one of which advance toward the PDs, 14a to 14d, while, respective other of which advance toward the second lenses, 15a to 15d.

The PDs, 14a to 14d, which are mounted on the mount 13, detect at back surfaces thereof the respective portions of the optical signals that are split by the multi-layered dielectric films. Accordingly, the PDs, 14a to 14d, are mounted on the mount 13 such that back surfaces thereof face a surface of the mount 13. The second lenses, 15a to 15d, which are optically coupled with the first lenses, 12a to 12d, interposing the mount 13 therebetween. The optical signals output from the first lenses, 12a to 12d, passing the mount 13 and forming respective beam waists, enter the optical isolator as divergent beams. The optical isolator 21 transmits the optical signals that pass the mount 13 and cut stray light reflected after passing the second lenses, 15a to 15 d, and return back to the source units, 11a to 11d. The optical signals passing the optical isolator 21 enter the second lenses, 15a to 15d.

The optical multiplexing system 19, which is optically coupled with the second lenses, 15a to 15d, multiplexes the optical signals. Referring to FIG. 1, the optical multiplexing system 19 includes first and second WDM filters, 16 and 17, a mirror 18, and a polarization beam combiner (PBC) 20. The mirror 18, which optically couples with the second lenses, 15a to 15d, has a reflecting surface disposed on optical axes of two of the second lenses, 15a and 15b, and inclined thereto. The first WDM filter 16, which is disposed on an optical axis of the second lenses 15c and inclined thereto, transmits the optical signal coming from the second lens 15c but reflects the optical signal coming from the mirror 18. Thus, two optical signals, one of which comes from the second lens 15a and reflected by the mirror 18 and another comes from the second lens 15c, in optical axes thereof may be aligned by the first WDM filter 16, that is, the first WDM filter 16 reflects the optical signal coming from the second lens 15a but transmits the optical signal coming from the second lens 15c.

The second WDM filter 17, which optically couples with the one of the second lenses 15d, has a wavelength selective surface positioned on the optical axis of the second lens 15d and inclined therewith. The second WDM filter 17 transmits the optical signal coming from the second lens 15d; while, reflects the optical signal coming from the second lens 15b through the mirror 18, which aligns the optical axis of the former optical signal with the optical axis of the latter optical signal thereby multiplex two optical signals. The PBC 20, which has a transparent body, may further multiplex a multiplexed optical signal coming from the first WDM filter 16 with another multiplexed optical signal coming from the second WDM filter 17. The optical signal multiplexed by the PBC 20 is externally output through the window provided in the housing 2.

The coupling portion 3, which has a cylindrical shape, includes a lens 22 and a fiber stub, where FIG. 1 shows a cross section of the coupling portion 3. The lens 22 optically couples with the optical multiplexing system 19 within the housing 2, while the fiber stub secures an external fiber. The lens 22 concentrates the optical signal multiplexed by the optical multiplexing system 19 onto the end of the external fiber secured in the stub. The optical coupling portion 3 is aligned with the optical axis of this optical signal multiplexed by the PBC 20 and fixed to the housing 2. The coupling portion 3 may further provide an optical isolator that prevents stray light from entering the housing 2.

Figure 3:
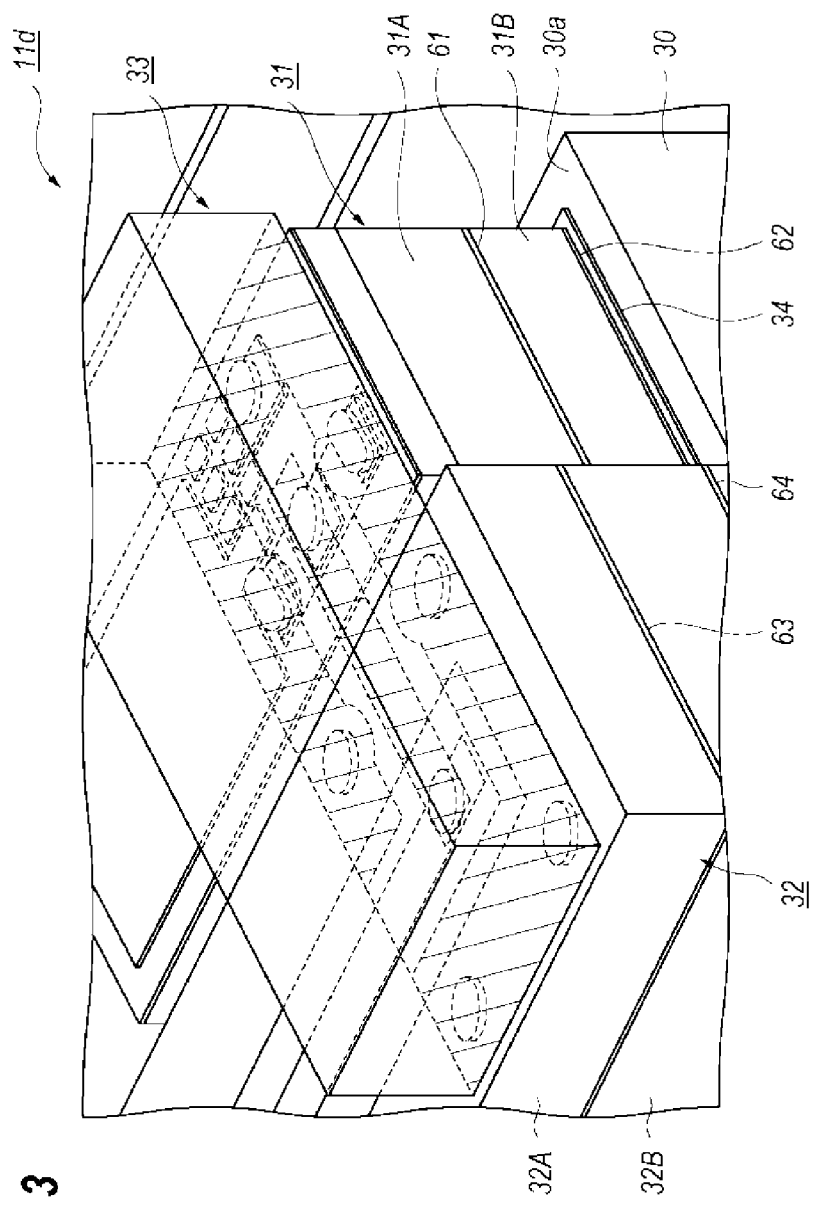
FIG. 3 is a perspective view magnifying one of the source units shown in FIG. 2.
Figure 4:
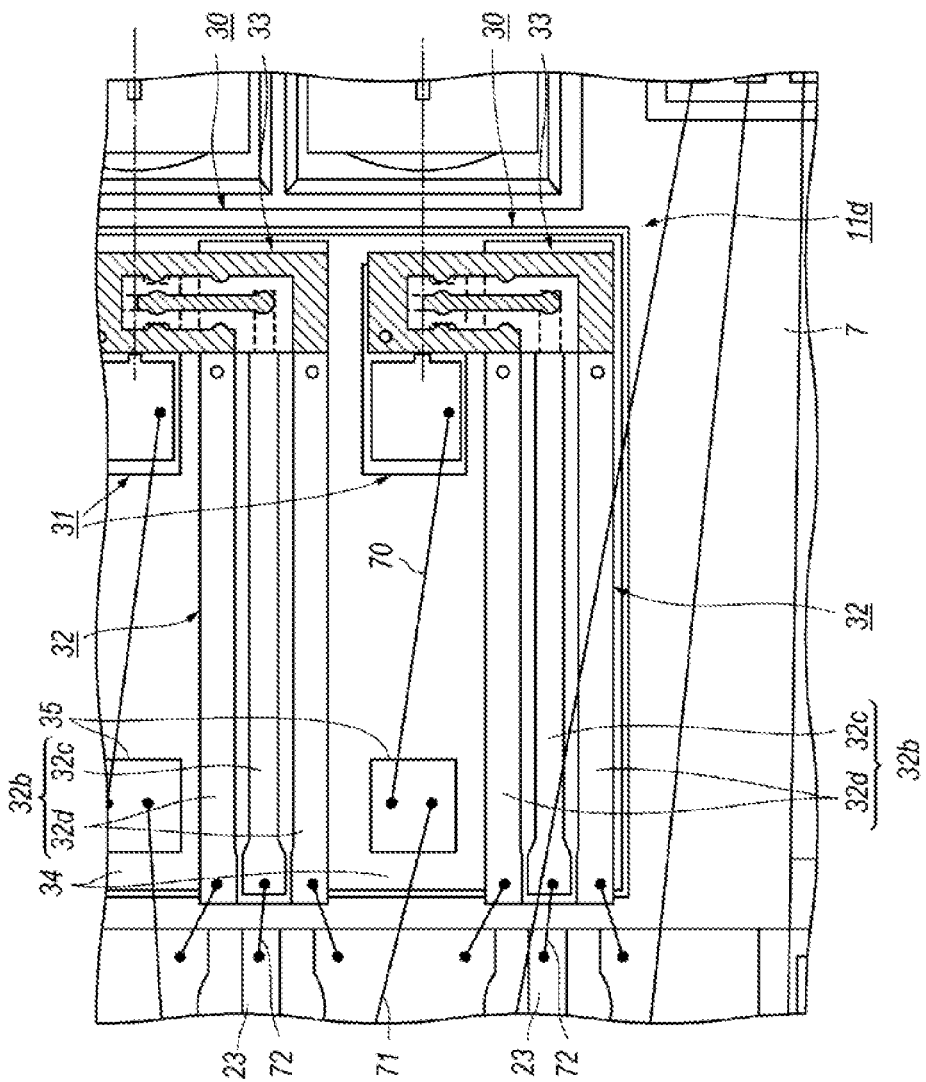
FIG. 4 is a plan view of one of the source units.

FIG. 3 is a perspective view of one of the source units 11d, and FIG. 4 is a plan view of the source unit 11d. Other source units, 11a to 11c, not shown in FIG. 3 and FIG. 4 have arrangements substantially same with those of the source unit 11d. Referring to FIG. 3 and FIG. 4, the source unit 11d includes a carrier 30, an LD element 31 and a wiring substrate 32 each mounted on the carrier 30, and a bridge substrate 33 mounted on both of the wiring substrate 32 and the LD element 31. The carrier 30, which is made of insulating material and provided on the base 7 of the housing 2, provides a plane top surface 30a thereof. The LD element 31 is disposed on the plane top surface 30a such that a back electrode thereof, which is a cathode electrode of the LD element 31, is in contact with a ground metal 34 provided on the plane surface 30a through a compensating substrate 31B under a semiconductor substrate 31A.

Referring to FIG. 4, the ground metal 34 also mounts a capacitor 35 thereon. The capacitor 35 in a bottom electrode thereof is in contact with the ground metal 34 through a conductive resin; while, a top electrode thereof is connected with the LD element 31 through a bonding wire 70, exactly, a portion of a laser diode (LD) in the LD element 31. Also, the top electrode of the capacitor 35 is connected with one of the terminals 24 in the feedthrough 2B via a bonding wire 71 as shown in FIG. 2.

Figure 5:
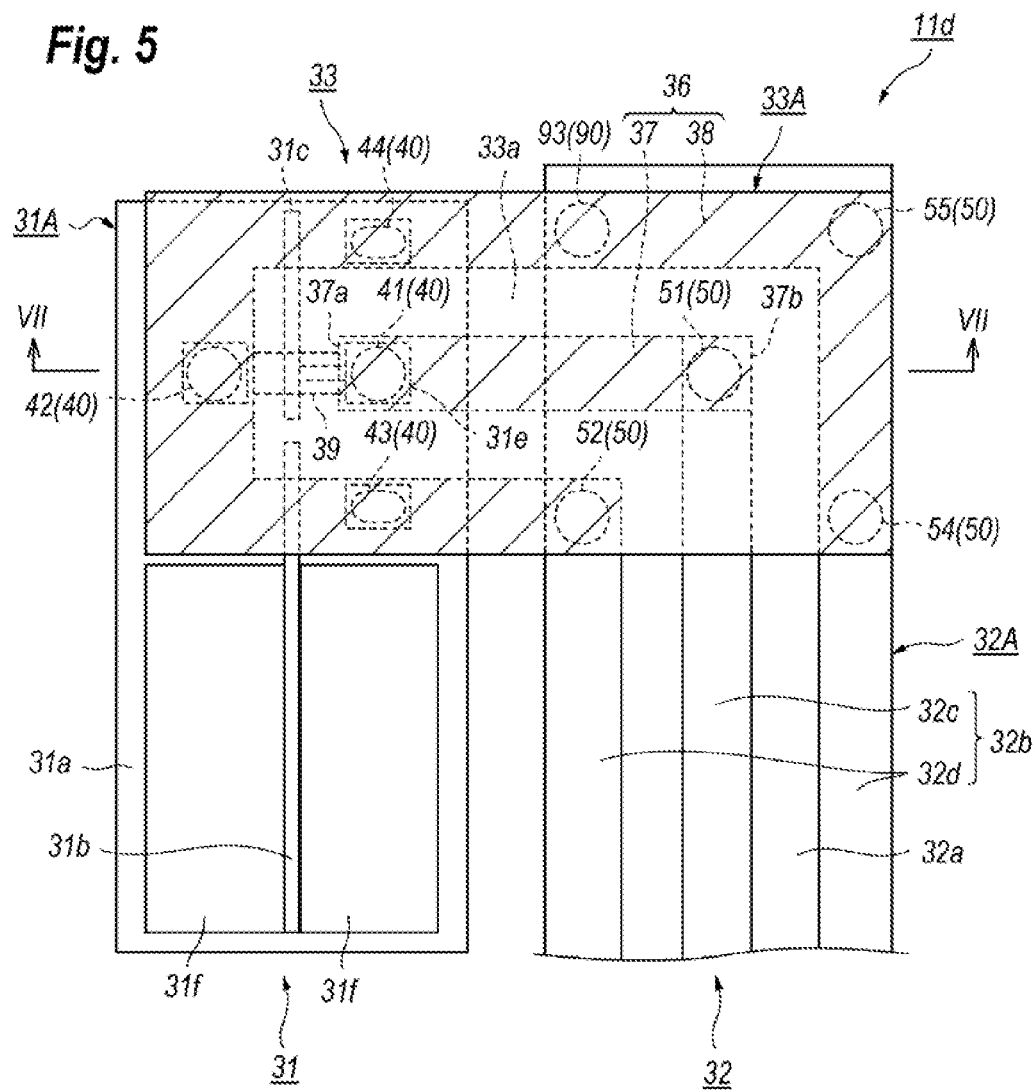
FIG. 5 is a plan view of an LD element, a bridge substrate, and a wiring substrate shown in FIG. 4.

FIG. 5 is a plan view schematically showing the source unit 11d, where FIG. 5 removes the carrier 30. The LD element 31 monolithically integrates an LD with an optical modulator type of electro-absorption (EA) modulator on a common semiconductor substrate 31A, which may be often called as an electro-absorption modulator integrating laser diode (EML). The LD element 31 includes the semiconductor substrate 31A, an anode electrode 31b for the LD and another anode electrode 31c for the EA modulator on a top surface 31a of the semiconductor substrate 31A.

The LD element 31 further provides a pad 31e, which is connected with the anode 31c of the EA modulator, and another pad 31f connected with the anode 31b of the LD element 31 each provided on the top surface 31a of the semiconductor substrate 31A. The former pad 31e for the EA modulator receives a driving signal and provides the driving signal to the anode 31c of the EA modulator; while, the other pad 31f receives a DC bias and provides this DC bias to the anode 31b of the LD element 31.

The wiring substrate 32, which has a rectangular plane shape, is disposed on the top surface 30a of the carrier 30 and side by side with respect to the LD element 31 so as to face one of a longitudinal sides of the rectangular shape with a longitudinal side of the semiconductor substrate 31A. The wiring substrate 32 includes an insulating base 32A and a co-planar line 32b on a top surface 32a thereof. The co-planar line 32b, which is a transmission line to carry the driving signal containing high frequency components to the anode 31c of the EA modulator, includes a signal line 32c and ground lines 32d.

The signal line 32c, which is made of metal film, extends along the longitudinal side of the wiring substrate 32, where an end of the signal line 32c is aligned with the pad 31e on the semiconductor substrate 31A, while, another end of the signal line 32c is connected with one of the signal line 23 provided on the feedthrough 2B through a bonding wire 72, which is shown in FIG. 4. The ground lines 32d are disposed in respective sides of the signal line 32c with a preset gap.

Figure 6:
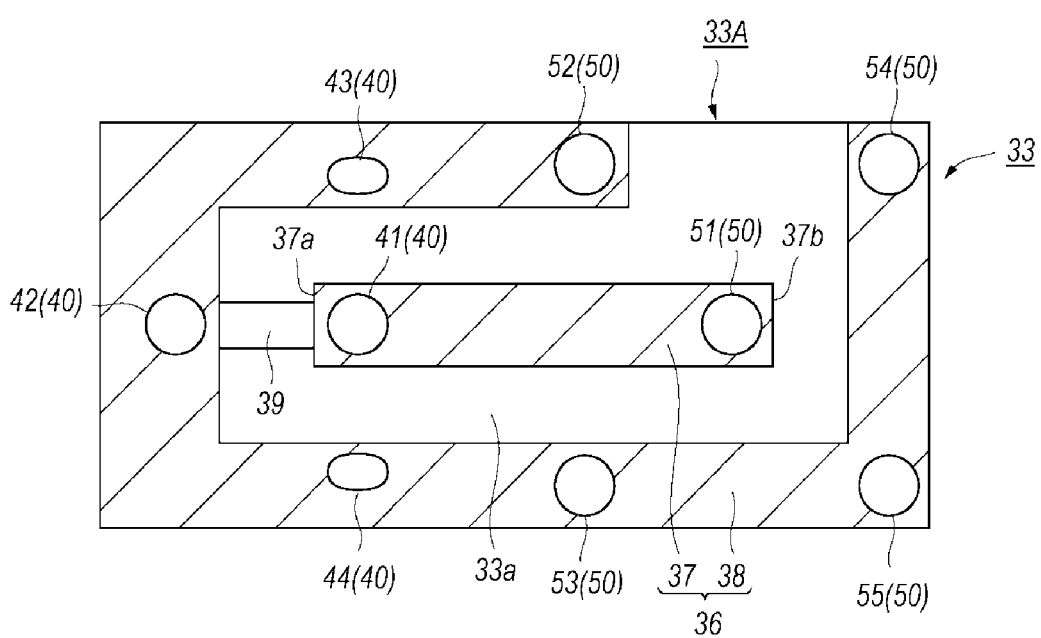
FIG. 6 is a plan view of the bridge substrate that is inspected from the LD element and the wiring substrate.

The bridge substrate 33, which is provided on the LD element 31 and the wiring substrate 32, connects the signal line 32c in the wiring substrate 32 with the pad 31e in the LD element 31, which means that the signal line 32c is connected with the anode 31c of the EA modulator through the bridge substrate 33 and the pad 31e. FIG. 6 is a plan view showing a top surface 33a of the bridge substrate 33. Referring to FIG. 6, the bridge substrate 33, which has a rectangular shape, includes an insulating base 33A and a co-planar line 36 on the insulating base 33A. The top surface 33a of the bridge substrate 33 faces the top surface 31a of the LD element 31A and the top surface 32a of the wiring substrate 32. The co-planar line 36 in the bridge substrate 33 carries the driving signal from the co-planar line 32b in the wiring substrate 32 to the pad 31e in the LD element 31.

Specifically, the co-planar line 36 in the bridge substrate 33 includes a signal line 37 and ground lines 38, where the signal line 37 extends along the longitudinal side of the rectangular shape of the bridge substrate 33. An end 37a of the signal line 37 faces and is in contact with the pad 31e, while, another end 37b of the signal line 37 faces and is in contact with an end of the signal line 32c in the wiring substrate 32. The signal line 37 disposes the ground lines 38 in respective sides thereof with a preset gap. The bridge substrate 33 further provides a terminator 39 between one end 37a of the signal line 37 and the ground line 38 to terminate the transmission line 36.

The source unit 11d further provides post groups, 40 and 50, on the bridge substrate 33 as shown in FIG. 6. The post group 40 is disposed between the top surface 31a of the semiconductor substrate 31A and the top surface 33a of the bridge substrate 33. The post group 40 may adjust or compensate inclination of the top surface 33a of the bridge substrate 33 against the top surface 31a of the semiconductor substrate 31A with a gap therebetween; that is, the post group 40 may set the top surface 33a of the bridge substrate 33 parallel to the top surface 31a of the semiconductor substrate 31A. The post group 40 includes posts, 41 to 44, each having a column shape.

Figure 7:
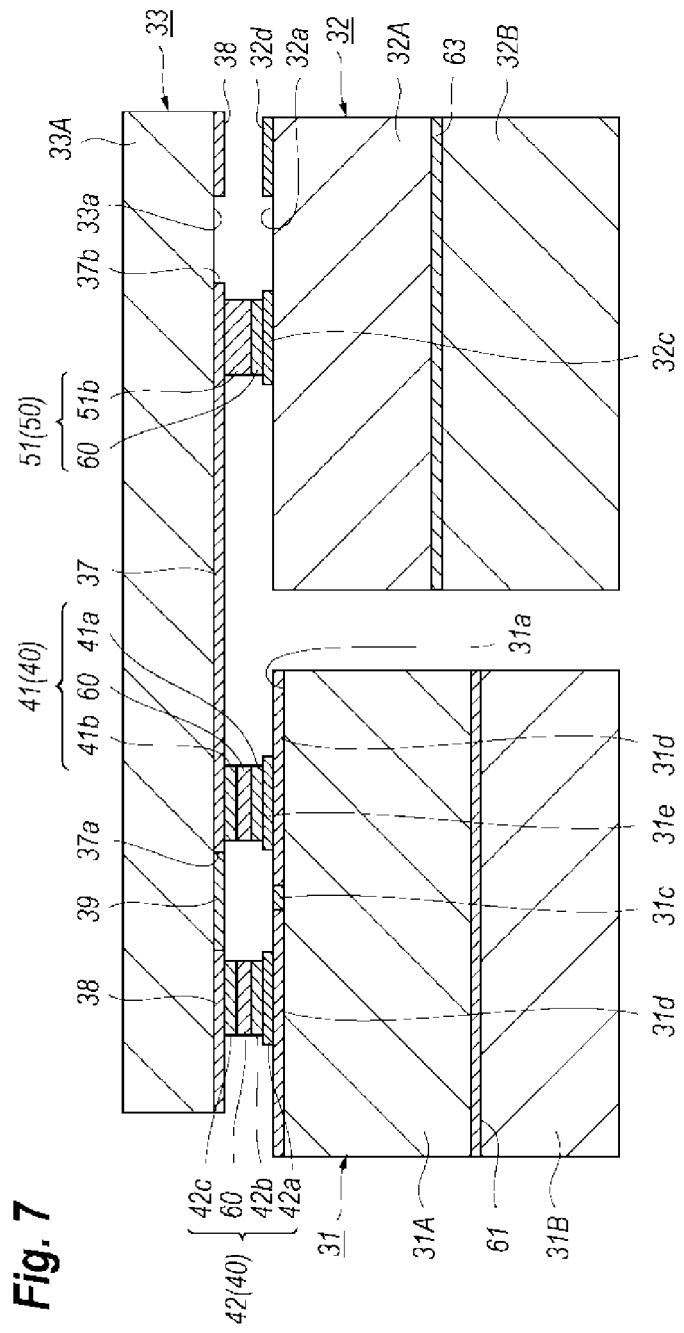
FIG. 7 is a cross sectional view of the semiconductor substrate, the bridge substrate, and the wiring substrate, where the cross section is taken along the line VII-VII indicated in FIG. 5.

FIG. 7 is a cross sectional view of the semiconductor substrate 31A, the wiring substrate 32, and the bridge substrate 33, where FIG. 7 is taken along the line VII-VII indicated in FIG. 5. The post 41, which is disposed between the pad 31e and the end 37a of the signal line 37 in the bridge substrate 33, includes a metal film 41a on the pad 31e, a metal film 41b on the signal line 37, and a conductive adhesive 60, typically solder. The metal film 41a may be formed on the pad 31e by plating; while, the metal film 41b may be formed on the signal line 37 also by plating. Two metal films, 41a and 41b, are rigidly connected and fixed by the conductive adhesive 60.

The post 42, which is disposed in one side of the pad 31e, namely, the side of the post 41, includes a metal film 42a on the top surface 31a of the semiconductor substrate 31A, another metal film 42b on the metal film, still another metal film 42c provided on the ground line 38, namely, on the top surface 33a of the bridge substrate 33, and a conductive adhesive 60 interposed between the metal films, 42b and 42c. The metal film 42a may be formed on the top surface 31a of the semiconductor substrate 31A by plating. In an alternative, the metal film 42a and the top surface 31a may interpose an insulating film 31d therebetween. The metal film 42b may be formed on the metal film 42a by plating, and the metal film 42c may be formed on the ground line 38 also by plating. The metal films, 42b and 42c, are rigidly fixed by the conductive adhesive 60. Other posts, 43 and 44, may have the arrangement same with those of the post 42.

Referring back to FIGS. 5 and 6 again, the post group 50, which is disposed between the top surface 32a of the wiring substrate 32 and the top surface 33a of the bridge substrate 33, may adjust or compensate a tilt or an inclination of the top surface 33a of the bridge substrate 33 against the top surface 32a of the wiring substrate 32; that is, the post group 50 may make the top surface 33a parallel to the top surface 32a. The post group 50 includes posts, 51 to 55, each having a column shape.

The post 51, as shown in FIG. 7, which is disposed between the signal line 32c in the wiring substrate 32 and an end 37b of the signal line 37 in the bridge substrate 33, electrically connects the signal line 32c with the signal line 37. The post 51 includes a metal film 51b on the signal line 37 and a conductive adhesive 60 between the metal film 51b and the signal line 32c. The metal film 51b may be formed on the signal line 37 by plating. The signal line 32c is rigidly fixed to the metal film 51b by the conductive adhesive 60.

The posts, 52 to 55, in the post group 50, which are disposed between the ground line 38 in the bridge substrate 33 and the ground line 32d in the wiring substrate 32, have an arrangement substantially same with those of the post 51 and formed by a process similar to those for the post 51.

Referring to FIG. 3 and FIG. 7, the optical module 1 according to the present embodiment may further provide compensating substrates, 31B and 32B, under the semiconductor substrate 31A and the wiring substrate 32, respectively, where the compensating substrates, 31B and 32B, have respective slab shapes. The compensating substrate 31B under the semiconductor substrate 31A but on the carrier 30 is made of material same with that of the wiring substrate 32, typically, ceramics such as aluminum nitride (AlN) and has a thickness equal to a thickness of the wiring substrate 32. In an embodiment, the wiring substrate 32 and the compensating substrate 31B have a thickness greater than 100 μm but thinner than 300 μm. The other compensating substrate 32B under the wiring substrate 32 but on the carrier 30 is made of material same with that of the semiconductor substrate 31A and has a thickness equal to that of the semiconductor substrate 31A, for instance, thicker than 100 μm but thinner than 300 μm.

The compensating substrate 31B in a top surface thereof faces a bottom surface of the semiconductor substrate 31A. Specifically, the top surface of the compensating substrate 31B provides a metal layer, which is not shown in the figures; while, the back surface of the semiconductor substrate 31A also provides a metal layer that is also not shown in the figures. Those two metal layers sandwich a conductive adhesive 61 therebetween, which rigidly fixes the semiconductor substrate 31A with the compensating substrate 32B. On the other hand, the compensating substrate 31B in a back surface thereof facing the top surface 30a of the carrier 30 provides a metal layer. The conductive adhesive 62, typically solder, is interposed between this metal layer and the ground metal 34 on the top surface 30a of the carrier 30 to fix the compensating substrate 31B with the carrier 30.

The compensating substrate 32B in a top surface thereof faces a back surface of the wiring substrate 32. The top surface of the compensating substrate 32B and the back surface of the wiring substrate 32 provide respective metal layers, which are not shown in the figures, and those metal layers are fixed with each other interposing a conductive adhesive 63, typically solder. Thus, the wiring substrate 32 and the compensating substrate 32B are fixed. The conductive adhesive 61 and the other conductor adhesive 63 have thicknesses substantially same with each other. The compensating substrate 32B in the back surface thereof also provides a metal layer that is not shown in the figures. A conductive adhesive 64 is interposed between this metal layer and the ground metal 34 in the top surface 30a of the carrier 30 to rigidly fix the compensating substrate 32B with the carrier 30.

Figure 8A:
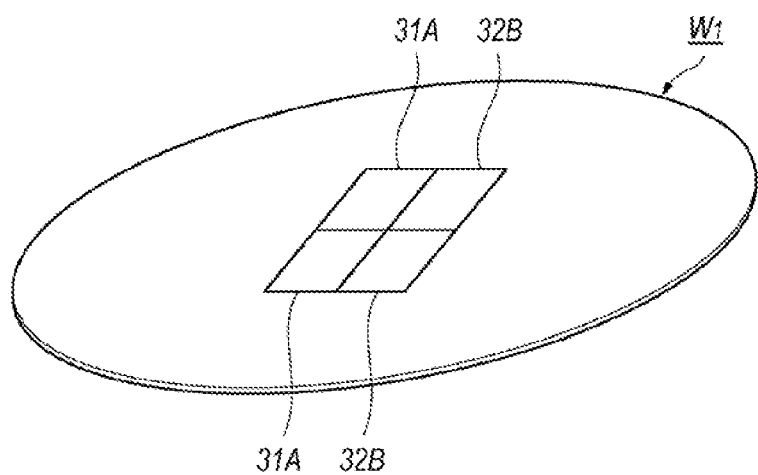
FIG. 8A is a perspective view of a wafer serving a semiconductor substrate and the second compensating substrate provided under the wiring substrate.

The compensating substrates, 31B and 32B, may be formed, or prepared by following procedures. FIG. 8A is a perspective view of a wafer $W_1$ for the semiconductor substrate 31A prepared for the LD element 31 and made of, for instance, indium phosphide (InP). The semiconductor substrates 31A may be obtained by dicing the wafer $W_1$.

Moreover, the compensating substrates 32B are also obtained from the wafer $W_1$ by dicing. That is, the semiconductor substrates 31A and the compensating substrates 32B are derived from the common wafer $W_1$; accordingly, the semiconductor substrates 31A and the compensating substrates 32B have thicknesses substantially same with each other within a range of preciseness requested for a semiconductor process.

Figure 8B:
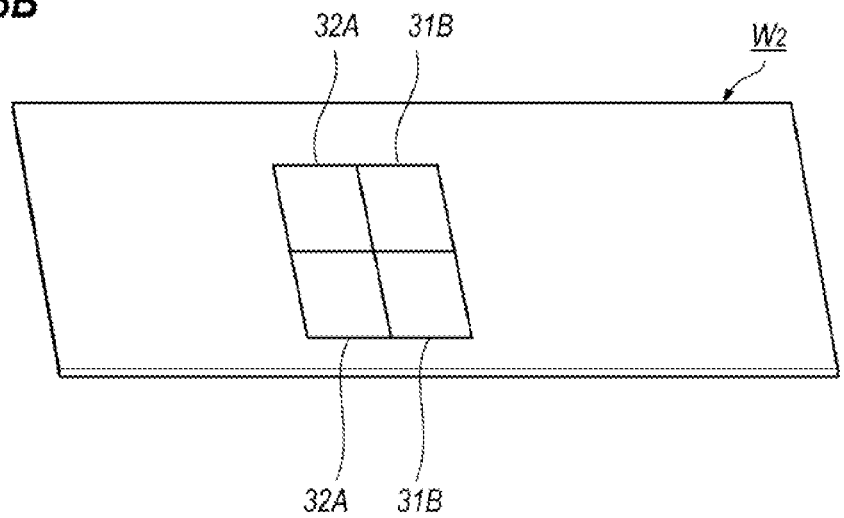
FIG. 8B is a perspective view of another wafer serving the wiring substrate and the second compensating substrate provided under the semiconductor substrate.

FIG. 8B is a perspective view of another wafer $W_2$ for an insulating base 32A of the wiring substrate 32 and another compensating substrate 31B. The insulating base 32A and the compensating substrates 31B are obtained by dicing the wafer $W_2$. Mounting the semiconductor substrate 31A on the compensating substrate 31B, and the wiring substrate 32 on the other compensating substrate 32B, and mounting those composite substrates on the carrier 30, the top surfaces, 31a and 32a, of the semiconductor substrate 31A and the wiring substrate 32, respectively, are substantially leveled measuring from the top surface 30a of the carrier 30.

Features and advantages of the optical module 1 according to the present invention will be described comparing with conventional arrangements in an optical module, where an LD element 31 is often connected with a signal line 32c through a bonding wire. However, recent optical communication system with a transmission speed thereof exceeding 100 Gbps, or sometimes reaching 400 Gbps, easily degrades signal quality by parasitic inductive component of a lengthened bonding wire. For instance, parasitic inductive components easily shifts characteristic impedance of a transmission line from a designed one, which causes impedance mismatching at the bonding wire thereby increases signal reflection and signal loss. The present optical module 1 provides the bridge substrate 33 disposed so as to face the co-planar line 36 thereof with the wiring substrate 32 and the semiconductor substrate 31A and connected with the pad 31e of the LD element 31 in the other end 37a of a signal line 37 in the bridge substrate 33, while, connected with the co-planar line 32b in the one end 37b thereof. This arrangement of the three substrates, 31A, 32, and 33, compared with an arrangement providing bonding wires for carrying a driving signal containing high frequency components to the LD element 31, may suppress the parasitic inductive components and degradation due to the impedance miss-matching.

Figure 9A:
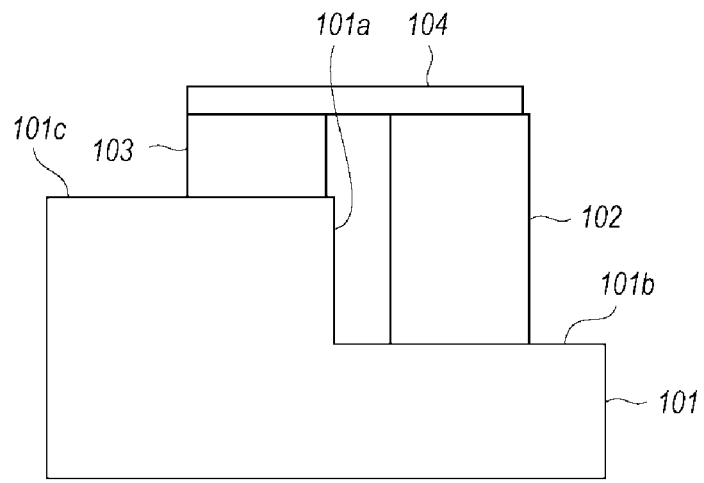
FIG. 9A schematically shows an arrangement where a carrier with a step mounts an LD element and a wiring substrate side by side and a bridge substrate extending from the LD element to the wiring substrate, and FIG. 9B schematically illustrates a status where the bridge substrate tilts against the LD element and the wiring substrate.
Figure 9B:
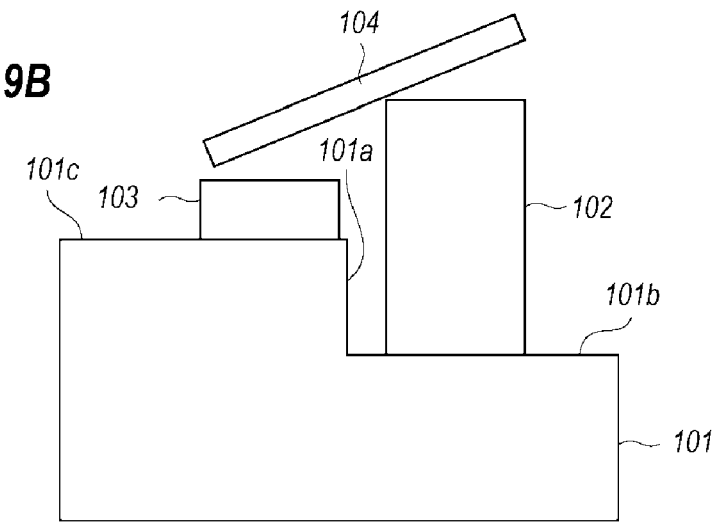
Figure 10:
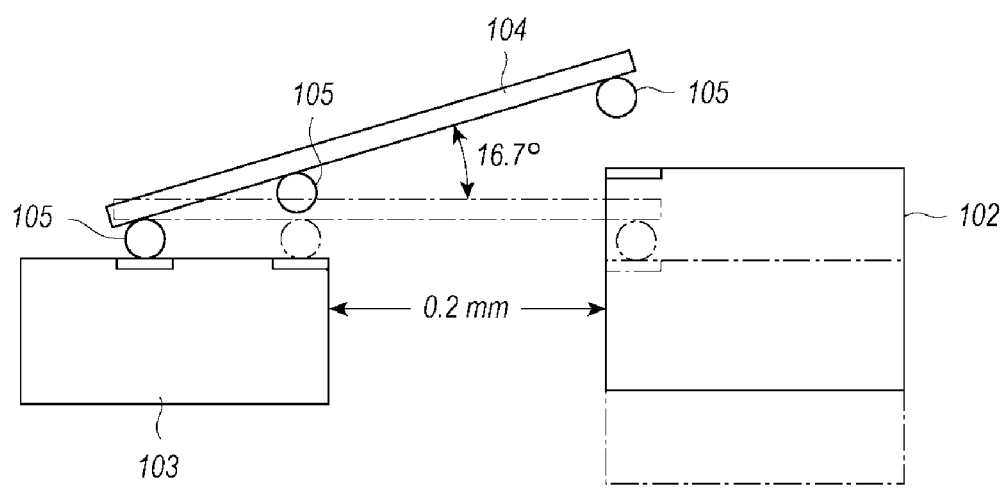
FIG. 10 is a side view schematically showing a status where the bridge substrate practically extends between the LD element and the wiring substrate.

When an LD element 102 and a wiring substrate 103 are disposed side by side on a carrier 101; but the LD element 102 and the wiring substrate 103 have respective thickness different from each other, a bridge substrate 104 disposed above the LD element 102 and the wiring substrate 103 inevitably inclines in a level thereof. In such a case, a step 101a formed in the carrier 101 may compensate the difference in the thicknesses between the LD element 102 and the wiring substrate 103, as shown in FIG. 9A. However, the step 101a in the carrier 101 is unable to compensate tolerances in the thicknesses of the LD element 102 and the wiring substrate 103, and dimensional tolerances of the step 101a between the surfaces, 101b and 101c, which results in lesser reliability of the contact by the conductive adhesive interposed between the LD element 102 and the bridge substrate 104, and between the wiring substrate 103 and the bridge substrate 104, as shown in FIG. 9B. In an example, when the LD element 102, the wiring substrate 103, and the step 101a have designed thicknesses and a height of a, b, and c (mm), respectively, but practical thicknesses and the height thereof become a+Δa, b+Δb, and c+Δc, respectively; a maximum shift in the level difference between the top surfaces of the LD element 102 and the wiring substrate 103 becomes Δa+Δb+Δc (mm). FIG. 10 schematically illustrates an inclination of the bridge substrate 104 connecting the LD element 102 with the wiring substrate 103, where the LD element 102 is disposed apart from the wiring substrate 103 by 0.2 mm. Setting a diameter of a bump solder 105 to be 0.03 mm, and tolerances in the thicknesses of the LD element 102 and the wiring substrate 103, and that of the step 101a to be 0.03 mm, ±0.01 mm, ±0.02 mm, and ±0.03 mm, respectively, the inclination caused in the bridge substrate 104 becomes 16.7° at most.

Figure 11:
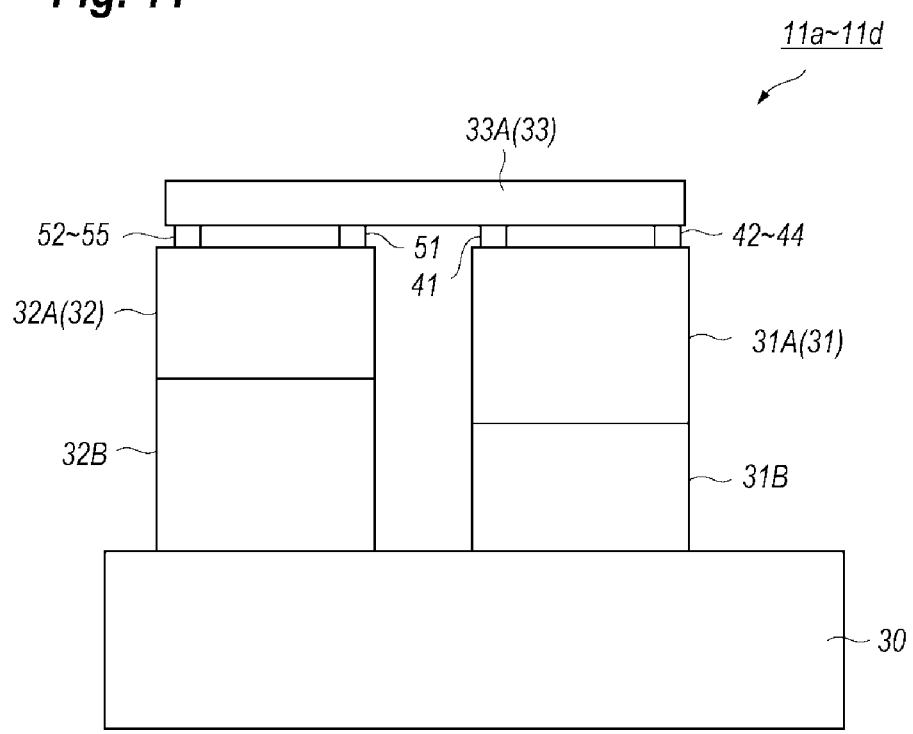
FIG. 11 is a side view showing a source unit according to the first embodiment of the present invention.

FIG. 11 is a side view schematically illustrating the source units, 11a to 11d, in the optical module 1. The source units, 11a to 11d, of the present embodiment provide the compensating substrates 31B under the semiconductor substrates 31A but above the carrier 30, where the compensating substrates 31B have a thickness equal to that of the insulating base 32A of the wiring substrate 32. Also, the source units, 11a to 11d, provide the compensating substrates 32B between the respective wiring substrates 32 and the carrier 30, where the compensating substrates 32B have a thickness equal to that of the semiconductor substrate 31A. Accordingly, the top surfaces 31a in the semiconductor substrate 31A and the top surfaces 32a in the wiring substrates 32 each measured from the top surface 30a of the carrier 30 become even in the level.

Moreover, the compensating substrates 32B, which made of material same with that of the semiconductor substrate 31A, may be obtained from the wafer $W_1$ common to both substrates, 32B and 31A, which means that the thicknesses of the substrates, 32B and 31A, become substantially equal to each other within a range often requested in a semiconductor process. Also, because the compensating substrate 31B and the insulating base 32A of the wiring substrate 32 are made of material same with each other, the both insulating substrates, 31B and 32A, may be obtained from the wafer $W_2$ common to both substrates, 31B and 32A, which means that the thicknesses of the substrates, 31B and 32A, become substantially equal to each other. In addition, the carrier 30 in the top surface 30a thereof is formed flat with substantially no step between an area for mounting the semiconductor substrate 31A and another area for mounting the wiring substrate 32. Thus, the optical module 1 may cause no inclination in the bridge substrate 33 that bridges between the LD element 31 and the wiring substrate 32.

The conductive adhesives, 61 and 63, which connect the bridge substrate 33 with the semiconductor substrate 31A and the wiring substrate 32, respectively, may have thicknesses substantially equal to each other. Such an arrangement in the conductive adhesives, 61 and 63, may further align the top levels between two assemblies, namely, the wiring substrate 32 with the compensating substrate 32B and the semiconductor substrate 31A with the compensating substrate 31B.

Modification

Figure 12:
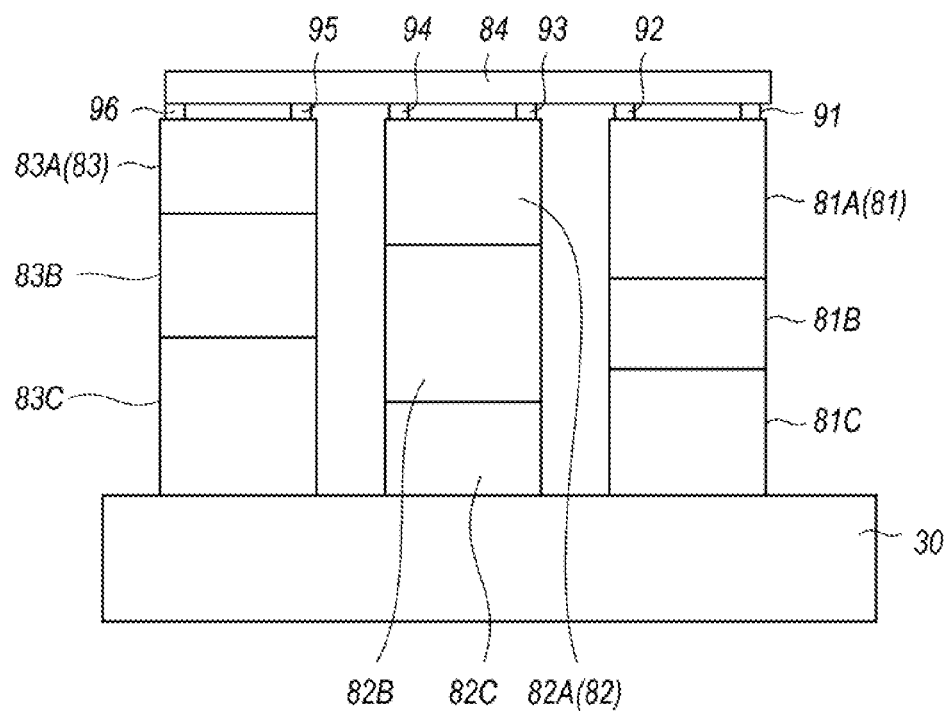
FIG. 12 is a side view showing a source unit modified from the source unit shown in FIG. 11.

FIG. 12 is a side view schematically illustrating an arrangement of a source unit 11e modified from those described above. The aforementioned source units, 11a to 11d, may be replaced by the source unit 11e shown in FIG. 12. The source unit 11e provides three assemblies, 81 to 83, and a bridge substrate 84 connecting those assemblies, 81 to 83, where at least one of the assemblies, 81 to 83, is an LD element type of EML similar to the LD element 31 described above, and at least one of assemblies, 81 to 83, is a wiring substrate having a co-planar line as a transmission line. Those assemblies, 81 to 83, which are mounted on a top surface 30a of the carrier 30, have substrates, 81A to 83A. When the assembly is the LD element, the substrate is a semiconductor substrate, while, when the assembly is a wiring substrate, the substrate is an insulating base. The bridge substrate 84 provides, similar to the aforementioned arrangements, an insulating base and a transmission line like a co-planar line. The bridge substrate 84 is electrically and physically connected with the assembly 81 via posts, 91 and 92, with the assembly 82 via posts, 93 and 94, and with the assembly 83 via posts, 95 and 96.

The substrate 81A in the assembly 81 accompanies compensating substrates, 81B and 81C, stacked against the top surface 30a of the carrier 30 in this order, where the compensating substrate 81B may be made of material same with that of the substrate 83A and have a thickness thereof equal to that of the substrate 83A, while, the compensating substrate 81C may be made of material same with that of the substrate 82A and have a thickness thereof equal to that of the substrate 82A. The embodiment stacks the compensating substrate 81B on the other compensating substrate 81C, but, the order of the stack of two substrates, 81B and 81C, may be optional.

The substrate 82A in the assembly 82 accompanies compensating substrates, 82B and 82C, stacked against the top surface 30a of the carrier 30 in this order, where the compensating substrate 82B may be made of material same with that of the substrate 83A and have a thickness thereof equal to that of the substrate 83A, while, the compensating substrate 82C may be made of material same with that of the substrate 81A and have a thickness thereof equal to that of the substrate 81A. The embodiment stacks the compensating substrate 82B on the other compensating substrate 82C, but, the order of the stack of two substrates, 82B and 82C, may be optional.

The substrate 83A in the assembly 83 accompanies compensating substrates, 83B and 83C, stacked against the top surface 30a of the carrier 30 in this order, where the compensating substrate 83B may be made of material same with that of the substrate 82A and have a thickness thereof equal to that of the substrate 82A, while, the compensating substrate 83C may be made of material same with that of the substrate 81A and have a thickness thereof equal to that of the substrate 81A. The embodiment stacks the compensating substrate 83B on the other compensating substrate 83C, but, the order of the stack of two substrates, 83B and 83C, may be optional.

Figure 13A:
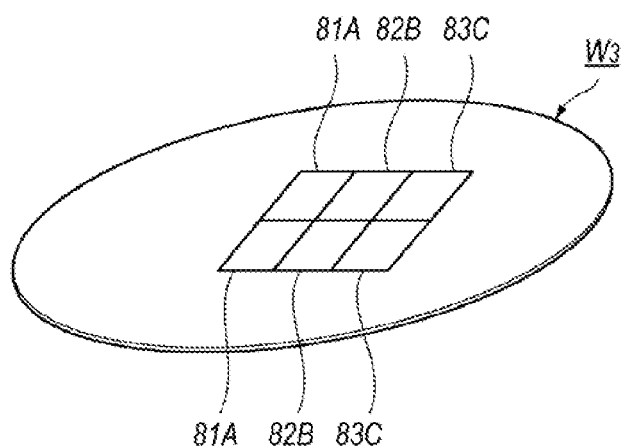
FIG. 13A is a perspective view showing a wafer serving the semiconductor substrates.
Figure 13B:
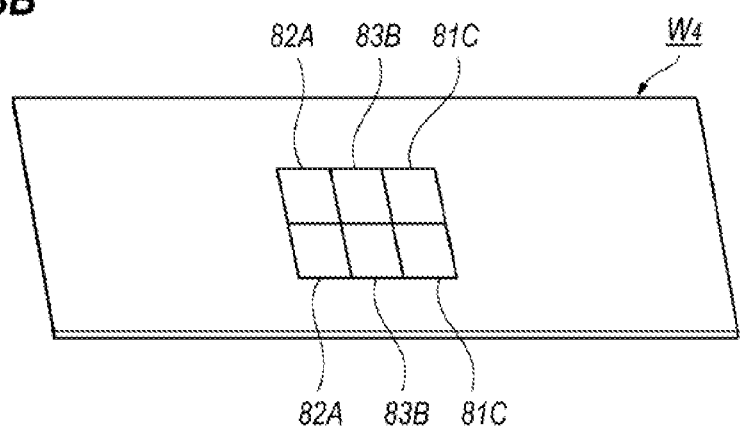
FIG. 13B is a perspective view showing another wafer serving the first substrates.
Figure 13C:
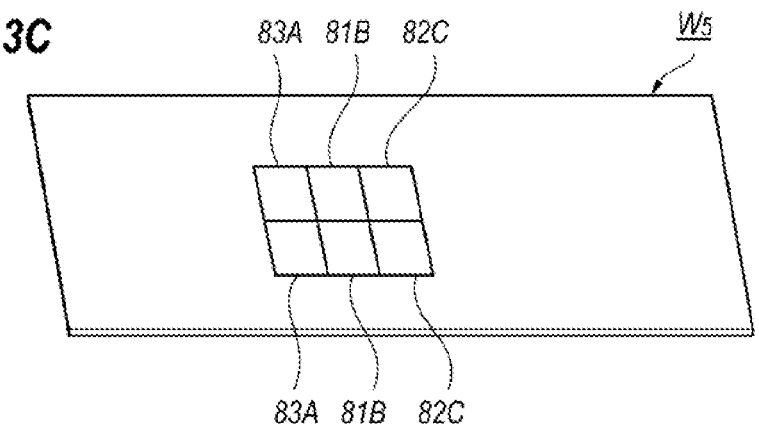
FIG. 13C is a perspective view showing still another wafer serving the second substrate.

Those compensating substrates, 81B to 83C, may be obtained by a process shown in FIG. 13A to FIG. 13C; that is, the substrate 81A and the compensating substrates, 82B and 83C, may be obtained from a wafer $W_3$ common to those substrates, 81A, 82B, and 83C by dicing the wafer $W_3$, as shown in FIG. 13A. FIG. 13B schematically illustrates a wafer $W_4$ that provides the substrate 82A and the compensating substrates, 83B and 81C. That is, the substrate 82A and the compensating substrates, 83B and 81C, may be obtained by dicing the wafer $W_4$. Also, as shown in FIG. 13C, the substrate 83A and the compensating substrates, 81B and 82C, may be obtained by dicing the wafer $W_5$. Thus, the substrate 81A and the compensating substrates, 82B and 83C, have a thickness equal to that of the wafer $W_3$; the substrate 82A and the compensating substrates, 83B and 81C, have a thickness equal to that of the wafer $W_4$; and the substrate 83A and the compensating substrates, 81B and 82C, have a thickness equal to that of the wafer $W_5$. Accordingly, the assemblies, 81 to 83, each stacking three types of the substrates derived from the wafers, $W_3$ to $W_4$, have top levels aligned with each other, and the bridge substrate 84 may electrically and physically connect three assemblies without substantial inclination thereof.

While particular embodiments of the present invention have been described herein for purposes of illustration, many modifications and changes will become apparent to those skilled in the art. For instance, a count of assemblies to be connected via a bridge substrate is not restricted to two (2) and three or more assemblies may be connected through the bridge substrate like the modification above described. Also, the embodiments thus described connect the substrates by interposing the post gropes including the posts with column shape. However, the connection is not restricted to the column posts. Bumps made of gold (Au) or other metals such as solder may connect the substrates. Accordingly, the appended claims are intended to encompass all such modifications and changes as fall within the true spirit and scope of this invention.

What is claimed is:

1. An optical module comprising:
   a carrier having a plane top surface;
   a first assembly provided on the plane top surface of the carrier, the first assembly stacking a first compensating substrate on the plane top surface of the carrier and a semiconductor substrate on the first compensating substrate, the semiconductor substrate including a laser diode (LD) element therein;
   a second assembly provided on the plane top surface of the carrier, the second assembly stacking a second compensating substrate on the plane top surface of the carrier and a wiring substrate on the second compensating substrate; and
   a bridge substrate provided on the wiring substrate and the semiconductor substrate, the bridge substrate electrically connecting the wiring substrate with the LD element in the semiconductor substrate,
   wherein the first compensating substrate is made of a material same with a material of the wiring substrate and has a thickness substantially equal to a thickness of the wiring substrate, and the second compensating substrate is made of a material same with a material of the semiconductor substrate and has a thickness substantially equal to a thickness of the semiconductor substrate,
   wherein the semiconductor substrate has a top surface and the wiring substrate has a top surface leveled with the top surface of the semiconductor substrate,
   wherein the bridge substrate has a top surface facing the top surface of the semiconductor substrate and the top surface of the wiring substrate, and
   wherein the first compensate substrate has a first thickness different from a second thickness of the second compensate substrate.

2. The optical module according to claim 1,
   wherein the wiring substrate provides a transmission line for carrying a driving signal and the bridge substrate provides a transmission line, and
   wherein the LD element is driven by the driving signal provided from the transmission line in the wiring substrate through the transmission line in the bridge substrate.

3. The optical module according to claim 2,
   wherein the transmission line in the bridge substrate is terminated to a ground line provided in the bridge substrate and electrically connected with a ground layer in the semiconductor substrate.

4. The optical module according to claim 2,
   wherein the wiring substrate is fixed with the bridge substrate through posts that include electrically conductive adhesive, and
   wherein the LD element in the semiconductor substrate is fixed with the bridge substrate through posts that include electrically conductive adhesive.

5. The optical module according to claim 4,
   wherein the transmission line in the bridge substrate includes a signal line and ground lines constituting a co-planar line, and the transmission line in the wiring substrate includes a signal line and ground lines constituting another co-planar line, and
   wherein the signal line in the bridge substrate is connected with the signal line in the bridge substrate and the ground lines in the bridge substrate are connected with the ground lines in the wiring substrate each interposing the posts provided between the bridge substrate and the wiring substrate.

6. An optical module comprising:
   a plurality of source units that generate optical signals attributed to wavelengths different from each other, the source units each including,
   a carrier having a plane top surface;
   a first assembly provided on the plane top surface of the carrier, the first assembly stacking a first compensating substrate on the plane top surface of the carrier and a semiconductor substrate on the first compensating substrate, the semiconductor substrate including a laser diode (LD) element therein;
   a second assembly provided on the plane top surface of the carrier, the second assembly stacking a second compensating substrate on the plane top surface of the carrier and a wiring substrate on the second compensating substrate; and
   a bridge substrate extending from the wiring substrate to the LD element,
   wherein the first compensating substrate is made of a material same with a material of the wiring substrate and has a thickness substantially equal to a thickness of the wiring substrate, and the second compensating substrate is made of a material same with a material of the semiconductor substrate and has a thickness substantially equal to a thickness of the semiconductor substrate;
   an optical multiplexing system that multiplexes the optical signals output from the source units; and
   a housing for enclosing the source units and the optical multiplexing system, the housing including a feedthrough to provide driving signals and biases for the respective LD elements in the source units and a coupling portion for outputting a wavelength multiplexing signal multiplexed in the optical multiplexing system,
   wherein the first compensate substrate has a first thickness different from a second thickness of the second compensate substrate,
   wherein the semiconductor substrate has a top surface and the wiring substrate has a top surface leveled with the top surface of the semiconductor substrate, and
   wherein the bridge substrate has a top surface facing the top surface of the semiconductor substrate and the top surface of the wiring substrate.

7. The optical module according to claim 6,
   wherein the wiring substrate provides a transmission line for carrying a driving signal and the bridge substrate provides a transmission line, and
   wherein the LD element is driven by the driving signal provided from the transmission line in the wiring substrate through the transmission line in the bridge substrate.

8. The optical module according to claim 7,
wherein the transmission line in the bridge substrate is terminated to a ground line provided in the bridge substrate and electrically connected with a ground layer in the semiconductor substrate.

9. The optical module according to claim 7,
wherein the wiring substrate is fixed with the bridge substrate through posts that include electrically conductive adhesive, and
wherein the LD element in the semiconductor substrate is fixed with the bridge substrate through posts that include electrically conductive adhesive.

10. The optical module according to claim 9,
wherein the transmission line in the bridge substrate includes a signal line and ground lines constituting a co-planar line, and the transmission line in the wiring substrate includes a signal line and ground lines constituting another co-planar line, and
wherein the signal line in the bridge substrate is connected with the signal line in the bridge substrate and the ground lines in the bridge substrate are connected with the ground lines in the wiring substrate each interposing the posts provided between the bridge substrate and the wiring substrate.

* * * * *